(12) United States Patent
Yamauchi

(10) Patent No.: US 10,416,400 B2
(45) Date of Patent: Sep. 17, 2019

(54) SEMICONDUCTOR MODULE

(71) Applicant: SUMITOMO ELECTRIC DEVICE INNOVATIONS, INC., Yokohama-shi (JP)

(72) Inventor: Yasuyuki Yamauchi, Yokohama (JP)

(73) Assignee: Sumitomo Electric Device Innovations, Inc., Yokohama-shi (JP)

( * ) Notice: Subject to any disclaimer, the term of this patent is extended or adjusted under 35 U.S.C. 154(b) by 0 days.

(21) Appl. No.: 15/819,829

(22) Filed: Nov. 21, 2017

(65) Prior Publication Data

US 2018/0149818 A1  May 31, 2018

(30) Foreign Application Priority Data

Nov. 25, 2016 (JP) ................. 2016-229362

(51) Int. Cl.
*G02B 6/42* (2006.01)
*H01L 23/00* (2006.01)
*H01S 5/022* (2006.01)
*H04B 10/2575* (2013.01)
*H01S 5/026* (2006.01)
(Continued)

(52) U.S. Cl.
CPC ......... *G02B 6/4279* (2013.01); *G02B 6/4204* (2013.01); *H01L 24/48* (2013.01); *H01S 5/0265* (2013.01); *H01S 5/02284* (2013.01); *H04B 10/2575* (2013.01); *H01L 2224/48091* (2013.01); *H01L 2224/48227* (2013.01); *H01L 2224/73265* (2013.01); *H01L 2924/1421* (2013.01); *H01S 5/005* (2013.01); *H01S 5/02216* (2013.01); *H01S 5/02248* (2013.01); *H01S 5/02276* (2013.01); *H01S 5/02415* (2013.01); *H01S 5/02438* (2013.01)

(58) Field of Classification Search
CPC ....... H01L 23/043–057; H01L 21/4867; H01S 5/022–02492; H04B 10/2575–25759; G02B 6/4256–4265
See application file for complete search history.

(56) References Cited

U.S. PATENT DOCUMENTS

2003/0142712 A1* 7/2003 Ikeda ................ H01S 5/02415
372/36
2005/0208701 A1* 9/2005 Jeong ................ H01L 21/6835
438/106

(Continued)

FOREIGN PATENT DOCUMENTS

JP   H05-327031 A   12/1993

*Primary Examiner* — Stephen M Bradley
(74) *Attorney, Agent, or Firm* — Baker Botts L.L.P.; Michael A. Sartori

(57) ABSTRACT

A semiconductor module is disclosed. The semiconductor module includes a housing that encloses on a bottom thereof a spacer and a wiring substrate that mounts a semiconductor element thereon. The housing includes a feedthrough that secures one end of a transmission substrate. The other end of the transmission substrate faces the wiring substrate and the spacer. The other end of the transmission substrate provides a lower end and an upper end that form an extension protruding toward the wiring substrate. The upper end is set so close to the wiring substrate but the lower end forms a space for receiving a surplus adhesive oozing between the spacer and the wiring substrate.

7 Claims, 5 Drawing Sheets

(51) Int. Cl.
*H01S 5/00* (2006.01)
*H01S 5/024* (2006.01)

(56) References Cited

U.S. PATENT DOCUMENTS

2005/0213882 A1   9/2005  Go et al.
2006/0083517 A1*  4/2006  Saito .................... G02B 6/4201
                                                         398/140

* cited by examiner

SEMICONDUCTOR MODULE

BACKGROUND OF THE INVENTION

Field of the Invention

The present invention relates to a semiconductor module that implements a semiconductor element not only electrically operable module but optically operable module.

Background Arts

A Japanese Patent laid open No. JP-H05-327031 has disclosed an optical semiconductor module that implements a semiconductor laser diode (LD), a carrier mounting the LD, a substrate that connects an interior of the semiconductor module with an exterior, and a housing that encloses the LD, the carrier, and the interior portion of the substrate therein. The substrate extends within the housing and wire-bonded with the LD. The housing also implements a ther-mos-electric cooler (TEC) that control a temperature of the LD. The TEC provides a lower plate, through which heat is dissipated to the exterior of the housing, and an upper plate on which the LD is mounted.

One type of semiconductor modules includes a housing within which a spacer, a wiring substrate, a feedthrough, and a transmission substrate are installed. Provided on the spacer is the wiring substrate that mounts a semiconductor element and/or a semiconductor element. The wiring substrate provides a signal line connected with the semiconductor element, while, the semiconductor element provides an electrode. The feedthrough, which connects the interior of the housing with the exterior hereof, supports one of ends of the transmission substrate thereon. That is, the transmission substrate is cantilevered with the feedthrough and forms a space therebeneath in another end that faces an end of the wiring substrate, or an end of the semiconductor element. The transmission substrate provides a signal line, which carries a radio frequency (RF) signal to the semiconductor element, connected with a signal line on the wiring substrate, or a signal pad provided on the semiconductor element with a bonding wire.

When the bonding is long, that is, the transmission substrate in the another end is apart from the end of the wiring substrate, or the end of the semiconductor element, high frequency performance of the semiconductor module degrades because of parasitic inductance caused in the bonding wire. Accordingly, the bonding wire is preferably short as possible for suppressing the degradation in high frequencies.

However, when the transmission substrate is set very close to the wiring substrate, or the semiconductor element to shorten the length of the bonding wire, an adhesive, which fixes the wiring substrate, or the semiconductor element to the spacer arranged therebeneath, in a surplus portion or a residual portion oozing out between the wiring substrate, or the semiconductor element and the spacer possibly extends with a gap between the transmission substrate and the wiring substrate, or the semiconductor element, and spreads on a top surface of the transmission substrate and the wiring substrate, or the semiconductor element, which causes a short circuit between the signal line on the transmission substrate, or the wiring substrate; or makes the wire bonding to the signal line on the transmission substrate, or the wiring substrate impossible. Because the transmission substrate is cantilevered with the feedthrough, the transmission substrate is necessary to have a substantial thickness to maintain hardness thereof, or rigidity. Accordingly, the transmission substrate is impossible to thin in order to shorten a distance where the transmission substrate in an end thereof faces the end of the wiring substrate, or the semiconductor element to avoid the extension of the surplus or exuded adhesive in the gap between the transmission substrate and the wiring substrate, or the semiconductor element.

SUMMARY OF INVENTION

An aspect of the present invention relates to a semiconductor module that comprises, a semiconductor element, a wiring substrate, a spacer, a transmission substrate and a feedthrough. The wiring substrate mounts the semiconductor element thereon. The spacer fixes the wiring substrate thereon with an adhesive. The transmission substrate carries a radio frequency (RF) signal or the semiconductor element. The feedthrough supports one ends of the transmission substrate. A feature of the semiconductor module of the embodiment is that the wiring substrate is that the transmission substrate provides, in another end thereof that faces the wiring substrate and the spacer, an upper end and a lower end, where the lower end is retreated from the upper end to form a space for receiving the adhesive oozing out between the wiring substrate and the spacer.

Another aspect of the present invention also relates to a semiconductor module but excludes the wiring substrate. That is, the semiconductor module of the embodiment provides a feature that the spacer directly mounts the semiconductor element thereon. The transmission substrate in another end thereof provides an upper end and a lower end. The lower end is retreated from the upper end to form a space for receiving the adhesive oozing out between the semiconductor element and the spacer. That is, the upper end and the lower end of the transmission substrate face the semiconductor element not the wiring substrate, and the spacer.

BRIEF DESCRIPTION OF THE DRAWINGS

The foregoing and other purposes, aspects and advantages will be better understood from the following detailed description of a preferred embodiment of the invention with reference to the drawings, in which.

DESCRIPTION OF EMBODIMENT

Next, embodiment according to the present invention will be described as referring to drawings. In the description of the drawings, numerals or symbols same with or similar to each other will refer to elements same with or similar to each other without duplicating explanations. The present invention is not restricted to the embodiment, and includes those defined in claims and all modification and changes within the claims and equivalents thereof.

First Embodiment

Figure 1:
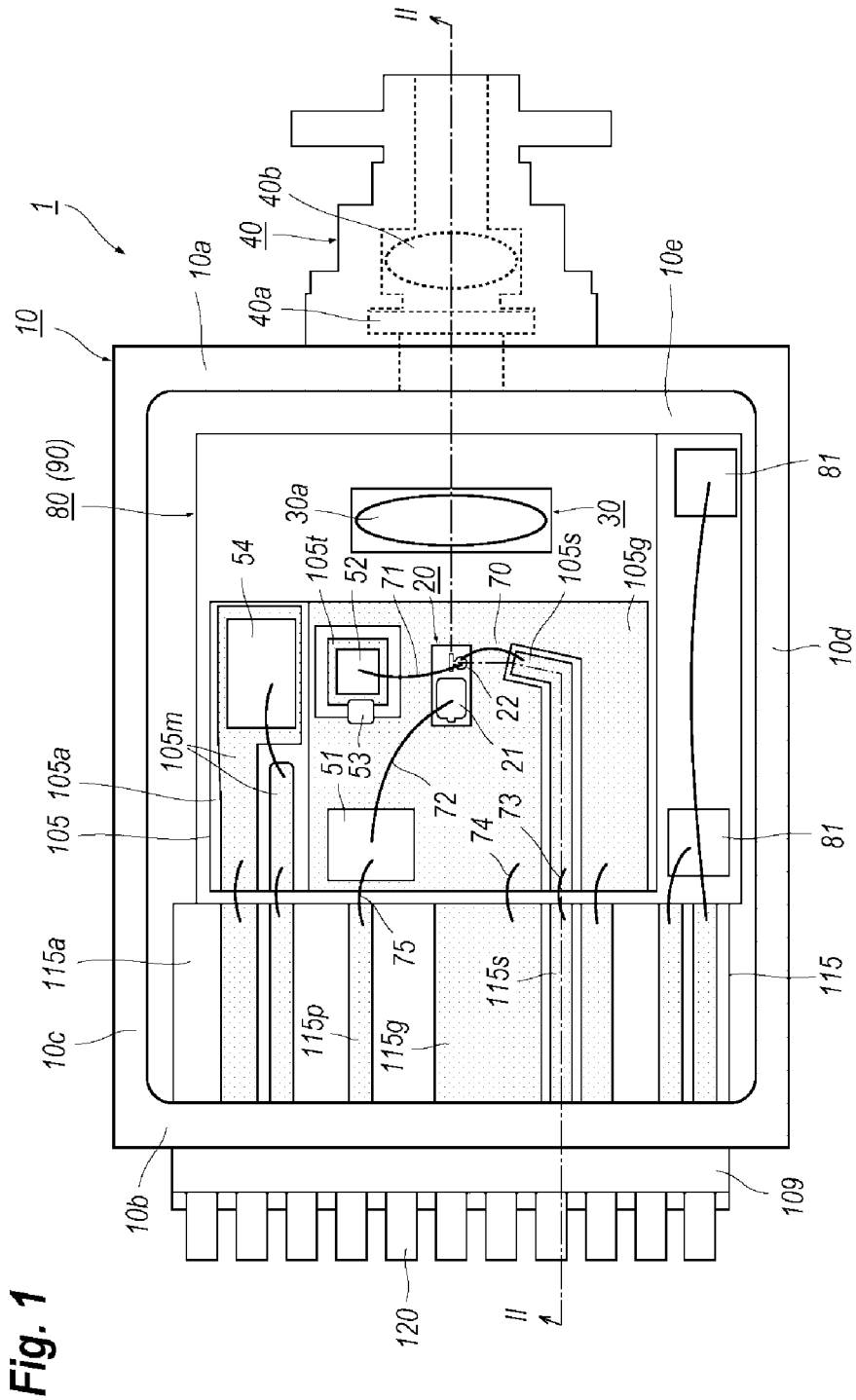
FIG. 1 is a plan view showing an inside of a semiconductor module according to the first embodiment of the present invention.
Figure 2:
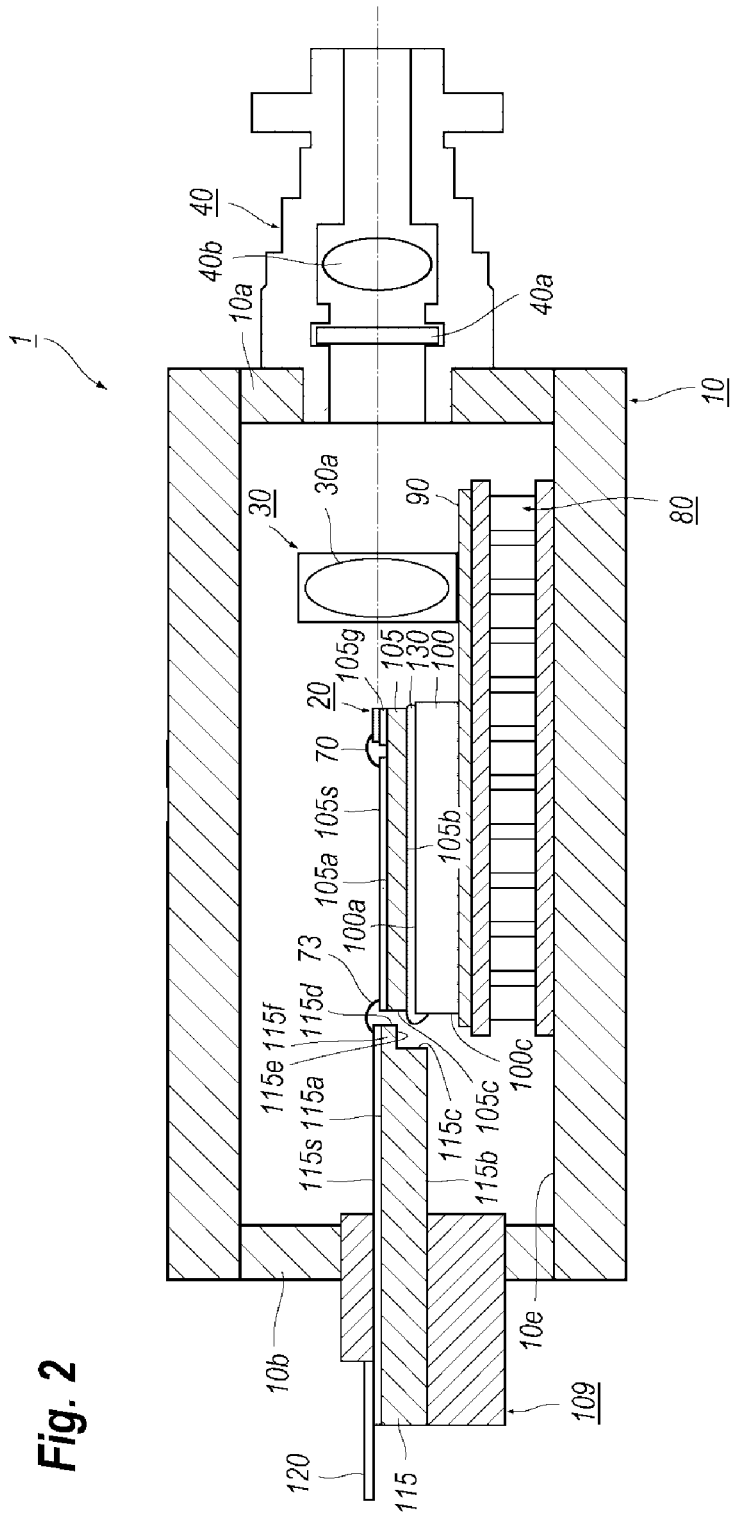
FIG. 2 shows a cross section of the semiconductor module shown in FIG. 1, where the cross section is taken along the line II-II indicated in FIG. 1.

FIG. 1 is a plan view showing an inside of a semiconductor module 1 according to the first embodiment of the present invention, and FIG. 2 shows a side cross section of the semiconductor module 1 taken along the line II-II indicated in FIG. 1. The semiconductor module 1 of the first embodiment is a type of transmitter optical sub-assembly (TOSA) applicable to the optical communication system. The semiconductor module 1 provides a shell 10, where FIG. 1 partially breaks the shell 10 to show an interior thereof. The shell 10, which may be made of alloy containing nickel (Ni), cobalt (Co), and iron (Fe), includes sides, 10a to 10d, and a bottom 10e. Two sides, 10a and 10b, face to each other along the longitudinal direction of the shell 10, while, rest two sides, 10c and 10d, also face to each other along the lateral direction of the shell 10. The bottom 10e is in contact with bottom ends of the respective sides, 10a to 10d. Thus, the four sides, 10a to 10d, and the bottom 10e form a space where optical and electrical components are enclosed therein.

The semiconductor module 1 provides, within the shell 10, a semiconductor element 20, a lens holder 30, a temperature control device 80, a carrier 90, a spacer 100, a wiring substrate 105, and a transmission substrate 115. The shell 10 may attach an optical receptacle 40 thereto in the front side 10a and provide feedthrough 109 in the rear side 10b. The explanation below assumes a direction of "rear" and/or "back" to be a side where the feedthrough 109 is provided with respect to the shell 10; while, another direction of "front" and/or "forward" corresponds to a side where the optical receptacle 40 is attached to the shell 10. However, these definitions are presented merely for the explanation sake, and do not affect the scope of the present invention. The semiconductor element 20, which integrates a semiconductor laser diode (LD) with an optical modulator on a substrate common to the LD and the optical modulator, provides an electrode 21 for the LD and another electrode 22 for the optical modulator. The semiconductor element 20 is arranged substantially in a center of the shell 10. The LD in the semiconductor element 20 may generate laser light, which is a continuous wave (CW), supplied with a bias current to the electrode 21. The laser light accompanies with an optical axis extending along a center of the shell 10. The optical modulator in the semiconductor element 20 may generate an optical signal by modulating the laser light responding to a modulation signal supplied to the electrode 22. The lens holder 30, which is disposed between the semiconductor element 20 and the front side 10a, secures a first lens 30a therein that is optically coupled with the semiconductor element 20. The optical receptacle 40, which is disposed in a side opposite to the semiconductor element 20 with respect to the first lens 30a, secures a window 40a and a second lens 40b. A root portion of the optical receptacle 40, which secures the window 40a, is dug within the front side 10a. The window 40a optically couples with first lens 30a. A rest portion of the optical receptacle 40 that secures the second lens 40b is arranged outside of the shell 10. The second lens 40b optically couples with the semiconductor element 20 through the window 40a and the first lens 30a. The optical signal output from the semiconductor element 20 and passing the optical receptacle 40 enters an optical fiber set within the optical receptacle 40.

The temperature controller 80, which may be a type of, what is called, thermo-electric cooler (TEC), is mounted on the bottom 10e of the shell 10. The temperature controller 80 may maintain a temperature of the semiconductor element 20 such that the semiconductor element 20 may generate the optical signal whose wavelength is kept constant in a designed wavelength. The temperature controller 80 provides two electrodes 81 to supply power into the temperature controller 80. The carrier 90, which is mounted on the temperature controller 80, mounts the spacer 100 and the lens holder 30 thereon. The carrier 90 and the spacer 100 may be made of metal such as copper tungsten (CuW). The spacer 100, which provides a front end and a rear end 100c facing the rear side 10b, fixes the wiring substrate 105 on a top surface 100a thereof with an adhesive 130 that may be solder, silver paste, and/or conductive resin. The lens holder 30 is arranged between the spacer 100 and the front side 10a.

The wiring substrate 105, which may be made of aluminum nitride (AlN), provides a top surface 105a, a back surface 105b, a front end, and a rear end 105c facing the read side 10b. The back surface 105b faces the front surface 100a of the spacer 100 and is fixed thereto by the adhesive 130; while, the top surface 105a provides a signal line 105s, a ground pattern 105g, a termination pattern 105t, and a monitor line 105m thereon. The signal line 105s extends from the side 105c along the longitudinal direction of the shell 10, but an end thereof opposite to the rear end 105c is bent toward the semiconductor element 20 from which a bonding wire 70 is wire-bonded to the electrode 22 of the semiconductor element 20 to provide the modulation signal thereto. The ground pattern 105g, which provides the ground level, surrounds the signal line 105s and mounts a first capacitor 51 thereon that operates as a bypassing capacitor to eliminate high frequency components contained in the bias current. The back electrode of the semiconductor element 20 and that of the capacitor 51 are in contact with and electrically connected to the ground pattern 105g; while, the top electrode of the capacitor 51 is connected with the electrode 21 of the semiconductor element 20 with a bonding wire 72 to supply the bias current to the LD of the semiconductor element 20. The termination pattern 105t, which is terminated to the ground pattern 105g through a terminator 53, mounts another capacitor 52 thereon whose top electrode is connected with the electrode 22 of the semiconductor element 20 through a bonding wire 71. That is, the signal line 105s may be terminated in an alternative current (AC) mode through the capacitor 52 and the terminator 53. The monitor line 105m mounts a thermistor 54 thereon, where the thermistor 54 may sense a temperature around the semiconductor element 20.

The feedthrough 109, which may be made of ceramics such as alumina ($Al_2O_3$), pierces the rear side 10b of the shell 10. The transmission substrate 115 includes a top surface 115a, a back surface 115b, a lower end 115c, an upper end 115d, and a step 115e between the lower end 115c and the upper end 115d. The transmission substrate 115, which is supported in one end thereof by the feedthrough 109, also pierces the rear side 10b of the shell 10. The transmission substrate 115 provides lead terminals 120 in a rear end thereof in the exterior of the shell 10. The front end of the transmission substrate 115 protrudes within the shell 10; specifically, the transmission substrate 115 is cantilevered by the feedthrough 109 with a front portion thereof forming an overhang against the feedthrough 109.

Figure 3:
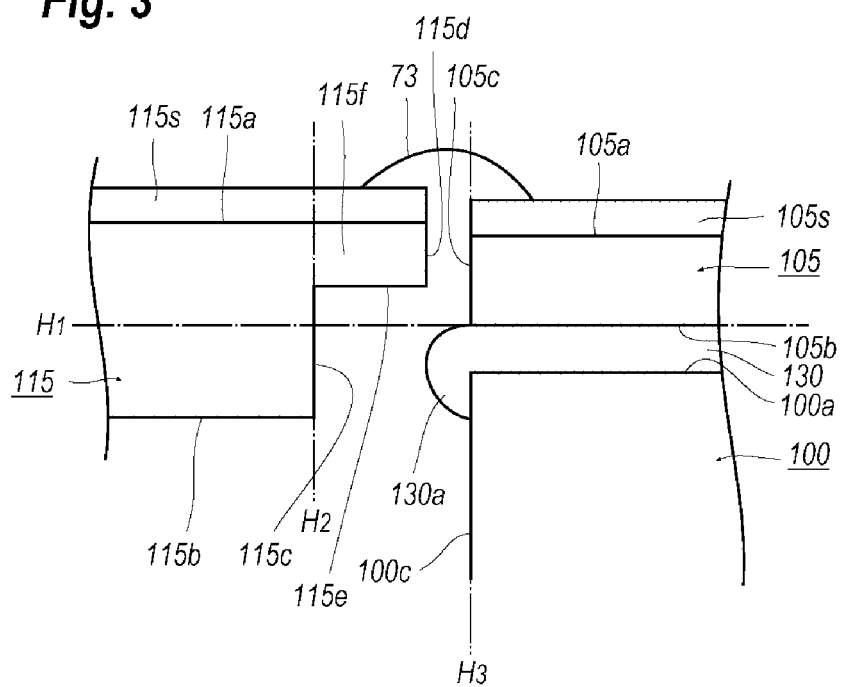
FIG. 3 magnifies an end of the transmission substrate and an end of the wiring substrate facing the end of the transmission substrate.

FIG. 3 magnifies the front end of the transmission substrate 105 and a rear end of the wiring substrate 105. The top surface 115a of the transmission substrate 115, which is leveled with respect to the bottom 10e of the shell 10, and apart therefrom by about 2.8 mm, provides the signal line 115s, the ground line 115g, and a power line 115p. The signal line 115s is connected with one of the lead terminals 120, and also with the signal line 105s on the wiring substrate 105 with a bonding wire 73 to carry the modulating signal to the semiconductor element 20 through the signal line 105s. The ground line 115g is connected with one of the lead terminals 120 and also with the ground pattern 105g on the wiring substrate 105 through a bonding wire 74. The power line 115p is connected with one of the lead terminals 120 and also with a capacitor 51 through the bonding wire 75. Thus, the lead terminal 120 may supply a bias current to the LD of the electrode 21 of the semiconductor element 20 through the power line 115p, the bonding wire 75, the capacitor 51, and the bonding wire 72. The back surface 115b of the transmission substrate 115 faces the bottom 10e of the shell 10, while the lower end 115c and the upper end 115d are arranged in the front end of the transmission substrate 115 and face the rear end 105c of the wiring substrate 105 and the rear end 100c of the spacer 100.

The lower end 115c, as FIG. 3 shows, continues to the back surface 115b of the transmission substrate 115 and faces the end 100c of the spacer 100 and the end 105c of the wiring substrate 105. In the present embodiment, the rear end 105c of the wiring substrate 105 is aligned with the rear end 100c of the spacer 100 on a virtual line $H_3$. A surplus adhesive 130a exudes between the spacer 100 and the wiring substrate 105 toward the transmission substrate 115, specifically, directing the lower end 115c of the transmission substrate 115. The upper end 115d continues to the top surface 115a where a lower edge of the upper end 115d positions above the virtual level H1, which corresponds to the bottom surface 105b of the wiring substrate 105. That is, the upper end 115d in the lower edge thereof is above the upper end of the exuded adhesive 130. Also, the upper end 115d faces the rear end 100c of the wiring substrate 105 with a distance therebetween smaller than a distance between the lower end 115c and the rear end 105c of the wiring substrate 105; specifically, the upper end 115d forms a gap of 0.1 mm against the rear end 105c of the wiring substrate 105. The signal line 115s on the transmission substrate 115 has an end, namely the front end thereof, on the extension 115f. A bonding wire 73 connects the signal line 115s on the extension 115f with the signal line 105s on the wiring substrate 105. The extension 115f of the present embodiment provides a length of, for instance, 0.5 mm along the longitudinal direction of the shell 10, which may be shorter than ⅕ of a distance between the feedthrough 109 and the rear end 105c of the wiring substrate 105, which is 2.5 mm in the present embodiment. The transmission substrate 115 may have a thickness in a portion except for the upper end 115d, which is between the step 115e and the back surface 115b, namely a length of the lower end 115c, of 0.8 mm and this thickness is preferably greater than a thickness of the extension 115e, that is, a length of the upper end 115d. Also, the extension 115f has the thickness, namely the length of the upper end 115d, preferably thinner than a thickness of the wiring substrate 105, which is 1.5 mm in the present embodiment. The step 115e connects the lower end 115c with the upper end 115d, and preferably makes a right angle against the respective ends, 115c and 115d. That is, the step 115e extends substantially parallel to the bottom 10e of the shell 10.

Next, advantages of the arrangements of the spacer 100, the wiring substrate 105, and the transmission substrate 115 will be described. The transmission substrate 115 in the front end thereof provides the extension 115f formed by the lower end 115c, the upper ends 115d, and the step 115e, thereby forming a space therebeneath capable of receiving exuded adhesive 130a: accordingly, the adhesive in the exuded portion 130a thereof is prevented from extending on the transmission substrate 115 and the wiring substrate 105 as seeping between the upper end 115d and the end 105c. Thus, failures caused in the transmission substrate 115 and the wiring substrate 105, such as a short circuit between the signal line 115s and the ground line 115g, or inability of the wire-bonding to a soldered signal line and/or a soldered ground line, are prevented.

Because the lower end 115c faces the rear end 100c of the spacer 100, exactly, the lower end 115c faces the adhesive exuded between the wiring substrate 105 and the spacer 100, the transmission substrate 115 may be formed thicker that may enhance the hardness of the transmission substrate 115, which may shows enough hardness in the cantilevered transmission substrate 115. Also, because the upper end 115d may be formed closer to the wiring substrate 105 without paying substantial attention for exudation of the surplus adhesive between the upper end 115d and the wiring substrate 105, the bonding wire 73 may be shortened.

The transmission substrate 115 in the extension 115f thereof may have a thickness smaller than a thickness of the wiring substrate 105. Also, the transmission substrate 115 in a thickness except for the extension 115f, that is, the length of the lower end 115c, may have a thickness greater than the thickness of the wiring substrate 105. The transmission substrate 115 may enhance the hardness thereof. The extension 115f may have a length along the longitudinal direction of the shell 10 smaller than ⅕ of a length between the feedthrough 109 and the rear end 105c of the wiring substrate 105. That is, the extension 115f may have the length at least for receiving exuded adhesive between the wiring substrate 105 and the spacer 100.

Second Embodiment

Figure 4:
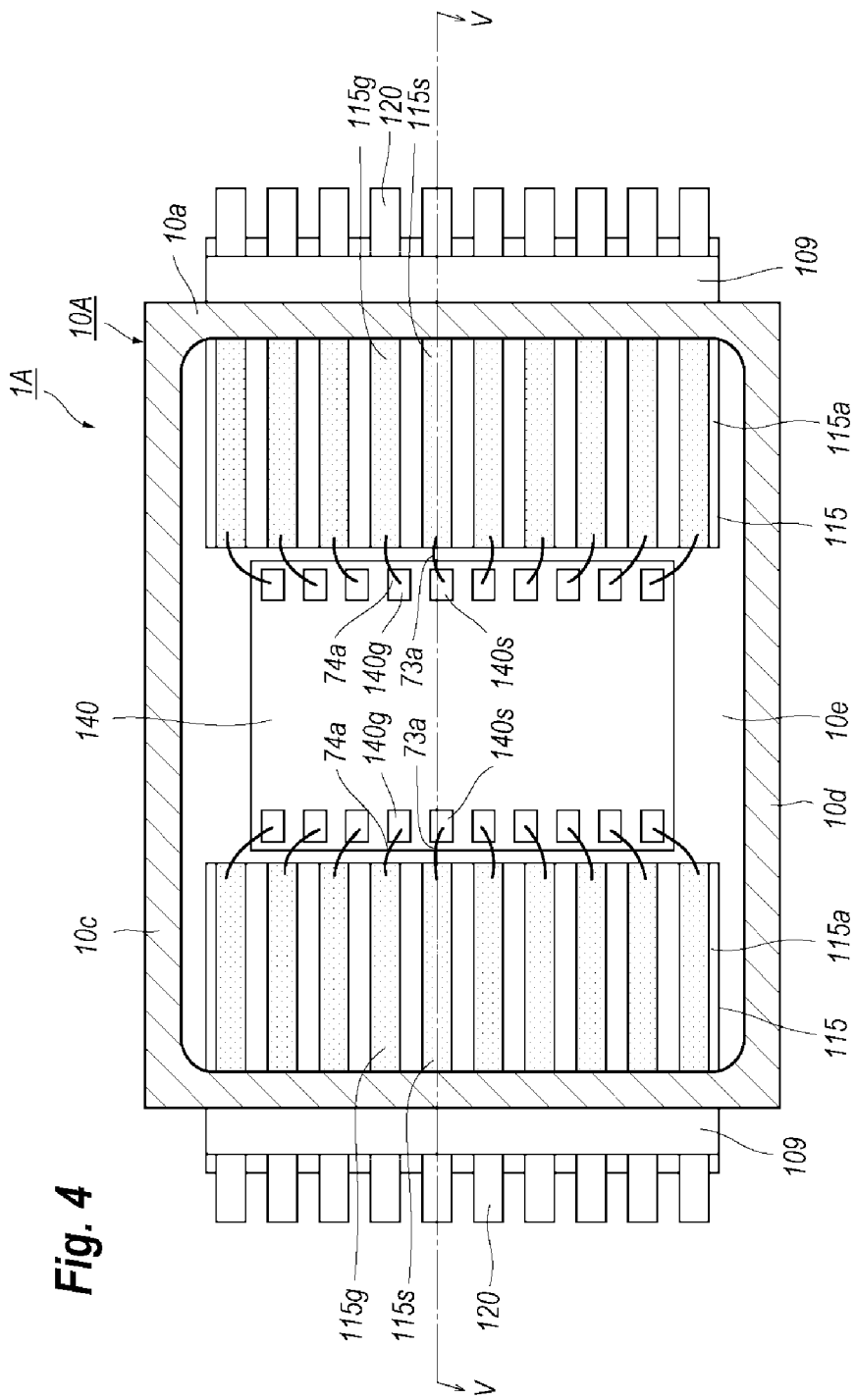
FIG. 4 is a plan view showing an inside of another semiconductor module according to the second embodiment of the present invention.
Figure 5:
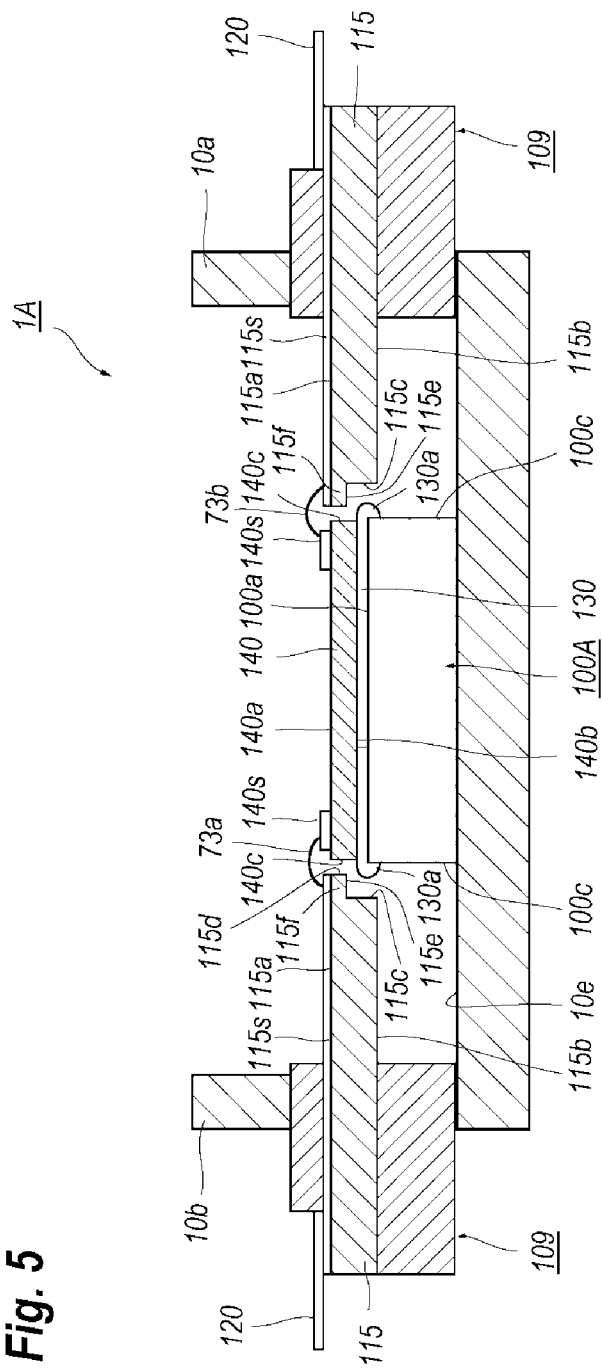
FIG. 5 shows a cross section of the semiconductor module shown in FIG. 4, where the cross section is taken along the line V-V indicated in FIG. 4.

FIG. 4 is a plan view showing an inside of a semiconductor module 1A according to the second embodiment of the present invention, and FIG. 5 shows a cross section of the semiconductor module 1A taken along the line V-V indicated in FIG. 4. The semiconductor module 1A provides the shell 10A whose lid is omitted in FIGS. 4 and 5. The shell 10A, which may be made of alloy containing nickel (Ni), cobalt (Co), and iron (Fe), includes the front side 10a, the rear side, 10b, two sides, 10c and 10d, and the bottom 10e, where the front and rear sides, 10a and 10b, face to each other along the longitudinal direction of the shell 10A; while, the rest two sides, 10c and 10d, face to each other along the lateral direction. Those sides, 10a to 10d, rise in respective ends of the bottom 10e to form a space within which a semiconductor element 140 is mounted. Specifically, the semiconductor module 1A provides, within the thus formed space, the semiconductor element 140, which is an electrical element different from the former semiconductor element 20, and a spacer 100A mounting the semiconductor element 140 thereon through an adhesive 130.

The spacer 100A, which is mounted on the bottom 10e of the shell 10A, provides a rear side 105c facing the rear side 10b. The spacer 100A may be made of copper tungsten (CuW) and mounts the semiconductor element 140 on a top surface 105a thereof through the adhesive 130. The semiconductor element 140 is, as mentioned above, a type of electrical device such as an integrated circuit (IC) of an LSI and a microwave monolithic IC (MMIC). The semiconductor element 140 may be a type of electrical device for an optical communication system, such as an optical modulator, a trans-impedance amplifier implemented in a front end of an optical receiver, and/or a laser diode driver (LDD). The semiconductor element 140 provides top and back surfaces, 140a and 140b, and a rear side 130c facing the transmission substrate 115. The top surface 140a forms pads including signal pads 140s and ground pads 140g. The back surface 140b of the semiconductor element 140 faces and is in contact with the top surface 100a of the spacer 100A through the adhesive 130.

As FIGS. 4 and 5 show, the semiconductor module 1A according to the second embodiment provides two feedthroughs 109 and two transmission substrates 115 each putting the semiconductor element 140 therebetween. That is, one of the transmission substrates 115 provides a radio-frequency (RF) signal to the semiconductor element 140, while, the other transmission substrate 115 extracts an RF signal processed by the semiconductor element 140. Thus, the feedthroughs 109 and the transmission substrate 115 may be used as an input port and an output port. The transmission substrates 115 have arrangements same to each other. Accordingly, the explanation below concentrates on one of the transmission substrates 115 and one of the feedthroughs 109. The transmission substrate provides a top surface 115a, a back surface 115b, a lower end 115c, an upper end 115d, and a step 115e. The transmission line 115 extends from the exterior to the interior of the shell 10A. The transmission substrate 115 may be supported with the shell 10A through the feedthrough 109 such that the transmission substrate 115 in a portion within the shell 10A leaves a space thereunder; that is, the transmission substrate 115 have a cantilevered arrangement. The top surface 115a of the transmission substrate 115 provides at least a signal line 115s and a ground line 115g, exactly, at least two ground lines putting the signal line 115s therebetween for constituting a co-planar arrangement. The transmission substrate 115 provides lead terminals in the outer end thereof. One of the lead terminals 120 is connected with the signal line 115s, while two lead terminals sandwiching the one of the terminals 115 for the signal line 115s are connected with the ground lines 115g on the transmission substrate 115.

Similar to the dimensional arrangement between the transmission substrate 115, the wiring substrate 105, and the spacer 100 in the aforementioned embodiment, the lower end 115c of the transmission substrate 115 in the present embodiment faces the interface between the back surface 140b of the semiconductor element 140 and the top surface of the spacer 100A; specifically, the lower end 115b faces the exuded portion 130a of the adhesive 130. Because the lower end 115c, the upper end 115d, and the step 115e between the lower end 115c and the upper end 115d form a space that may receive the exuded portion 130a of the adhesive 130, the exuded portion 130a of the adhesive is prevented from extending between the upper end 115d and the end 140c of the semiconductor element 140 even the upper end 115d and the end 140c form a gap enough narrow for the adhesive to be oozed out therebetween. The step 10e, similar to the step of the former embodiment, extends substantially parallel to the bottom 10e of the shell 10A and apart therefrom by, for instance, 2.8 mm. The signal line 115s on the transmission substrate 115 is connected with the signal pad 140s on the semiconductor element 140 with a bonding wire 73, and the ground lines 115g are connected with the ground pads 140g also provided on the semiconductor element 140 with bonding wires 74. Thus, the RF signal input to the semiconductor element 140 or extracted therefrom may be carried on the pseudo co-planar structure from the lead terminals to the pads on the semiconductor element 140.

The end of the transmission substrate 115 and that of the semiconductor element 140 will be further described. The lower end 115c is connected with the back surface 115b and faces the rear end 100c of the spacer 100A and the rear end 140c of the semiconductor element 140, where the rear end 140c of the semiconductor element 140 is aligned with the rear end 100c of the spacer 100A. In other words, the rear end 100c and the rear end 140c form a plane against the upper end 115d and the lower end 115c. The lower end 115c is retreated from the upper end 115d to form the extension 115f as leaving a space that may receive the exuded portion 130a of the adhesive 130. The gap formed between the upper end 115d and the side 140c is around 0.1 mm, which is enough narrow for the adhesive to be oozed out therebetween. However, the embodiment according to the present invention provides a space for receiving the adhesive exuded between the semiconductor element 140 and the spacer 100A, that is, the lower end 115c is apart from the rear end 100c of the spacer 100A and the rear end 140c of the semiconductor element 140 that is enough wide for the adhesive 130 to be prevented from oozing therebetween. Because the upper end 115d positions so closer to the semiconductor element 140, exactly, the signal pad 140s on the semiconductor element 140, the bonding wire 73a connecting the end of the signal line 115s with the signal pad 140s becomes shorter and the high frequency performance of the semiconductor module 1A may be maintained. The extension 115f preferably has a length along the longitudinal direction of the shell 10A shorter than one fifth (⅕) of a length from the end of the feedthrough 109 to the end 140c of the semiconductor element 140 facing the feedthrough 109. The lower end 115c preferably has a height greater than a height of the upper end 115d and also than a thickness of the semiconductor element 140. Also, the extension 115f preferably has a height smaller than the thickness of the semiconductor element 140. That is, a feature of the dimensional arrangement of the transmission substrate 115, the semiconductor element 140, and the spacer 100A is that the lower end 115c of the transmission substrate 115 faces the adhesive between the spacer 100 and the semiconductor element 140. Accordingly, the space formed beneath the extension 115f of the transmission substrate may securely receive the surplus and exuded adhesive 130a.

Thus, even the semiconductor element 140 is assembled on the spacer 100A close enough to the transmission substrate 115, the surplus adhesive exuding between the semiconductor element 140 and the spacer 100A may be prevented from oozing out between the semiconductor element 140 and the transmission substrate 115. Also, because the lower end 115c faces the end 100c of the spacer 100A, the height of the lower end 115c may be thicker than the thickness of the semiconductor element 140, which may enhance the hardness of the transmission substrate 115 even when the transmission substrate 115 has the cantilevered arrangement. Also, the transmission substrate 115, in particular, the end of the signal line 115s may be arranged so closer to the signal pad 140s on the semiconductor element 140; the bonding wire 73a connecting the signal line 115s with the signal pad 140s may be shortened. Also, because the lower end 115c faces the rear end 100c of the spacer 100A, the lower end 115c in the thickness thereof may be formed thicker than the semiconductor element 140, which may make the transmission substrate 115 hard and enhance the reliability even the transmission substrate 115 is cantilevered only by the feedthrough 109.

Also, the extension 115f in the transmission substrate 115 may be thinner than the semiconductor element 140, while, the transmission substrate 115 in the thickness except for the extension 115f, that is, the length of the lower end 115c, may be thicker than the semiconductor element 140. Furthermore, the extension 115f may have the length preferably shorter than 1/5 of the length from the feedthrough 109 to the end of the semiconductor element 140 facing the feedthrough 109. That is, the extension 115 may have the length only for forming the space therebeneath enough to receive the surplus or exuded adhesive oozing from the interface between the semiconductor element 140 and the spacer 100A.

While particular embodiment of the present invention has been described herein for purposes of illustration, many modifications and changes will become apparent to those skilled in the art. Accordingly, the appended claims are intended to encompass all such modifications and changes as fall within the true spirit and scope of this invention.

The present application claims the benefit of priority of Japanese Patent Application No. 2016-229362, filed on Nov. 25, 2016, which is incorporated herein by reference.

What is claimed is:

1. A semiconductor module, comprising:
   a semiconductor element;
   a wiring substrate that mounts the semiconductor element thereon;
   a spacer that fixes the wiring substrate thereon with an adhesive;
   a transmission substrate that carries a radio frequency (RF) signal provided to the semiconductor element; and
   a feedthrough that supports one of ends of the transmission substrate,
   wherein the transmission substrate provides, in another end thereof that faces the wiring substrate and the spacer, an upper end and a lower end that is retreated from the upper end to form a space for receiving the adhesive oozing out between the wiring substrate and the spacer;
   wherein the transmission substrate is cantilevered with the feedthrough and forms a space beneath the another end thereof.

2. The semiconductor module according to claim 1,
   wherein the lower end and the upper end of the transmission substrate form an extension with a length between the lower end and the upper end, and
   wherein the length of the extension is shorter than one fifth (1/5) of a distance between the feedthrough to an end of the wiring substrate facing the lower end of the transmission substrate.

3. The semiconductor module according to claim 1,
   wherein the housing provides a bottom on which the semiconductor element is mounted through the wiring substrate and the spacer, and
   wherein the lower end and the upper end of the transmission substrate form a step whose level measured from the bottom of the housing is higher than a level of an interface between the spacer and the wiring substrate from which the adhesive oozes out.

4. The semiconductor module according to claim 3,
   wherein the upper end and the lower end of the transmission substrate form an extension with a thickness corresponding to a length of the upper end, the thickness of the extension being greater than a thickness of the wiring substrate.

5. The semiconductor module according to claim 3,
   wherein the lower end of the transmission substrate has a thickness corresponding to a length thereof measured along a normal of the bottom of the housing, the thickness being greater than a thickness of the upper end.

6. The semiconductor module according to claim 1,
   wherein the wiring substrate has an end facing the transmission substrate and the spacer has an end facing the transmission substrate, and
   wherein the end of the wiring substrate is aligned with the end of the spacer.

7. The semiconductor module according to claim 1,
   wherein the transmission substrate provides a signal line and at least two ground lines sandwiching the signal line therebetween, and
   wherein the wiring substrate provides a signal line and a ground pattern, the signal line of the wiring substrate is connected with the signal line of the transmission substrate with a bonding wire.

* * * * *